United States Patent
Chen et al.

(10) Patent No.: US 6,920,026 B2
(45) Date of Patent: Jul. 19, 2005

(54) ESD PROTECTION CIRCUIT WITH WHOLE-CHIP ESD PROTECTION

(75) Inventors: Zi-Ping Chen, Taipei (TW); Chyh-Yih Chang, Taipei (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 233 days.

(21) Appl. No.: 10/426,625

(22) Filed: May 1, 2003

(65) Prior Publication Data
US 2003/0223166 A1 Dec. 4, 2003

(30) Foreign Application Priority Data

May 29, 2002 (TW) ..................................... 091111477 A

(51) Int. Cl.[7] .............................................. H02H 9/00
(52) U.S. Cl. ...................................................... 361/56
(58) Field of Search ........................................... 361/56

(56) References Cited

U.S. PATENT DOCUMENTS 5,717,560 A * 2/1998 Doyle et al. .................. 361/56
5,744,842 A * 4/1998 Ker ............................. 257/362
5,910,874 A * 6/1999 Iniewski et al. ............... 361/56
6,011,681 A * 1/2000 Ker et al. ..................... 361/111
6,072,219 A * 6/2000 Ker et al. ..................... 257/355
6,144,542 A * 11/2000 Ker et al. ..................... 361/111
6,385,116 B2 * 5/2002 Wang .......................... 365/226
6,628,488 B2 * 9/2003 Liu et al. ....................... 361/56
6,665,160 B2 * 12/2003 Lin et al. ....................... 361/56
6,671,153 B1 * 12/2003 Ker et al. ..................... 361/111
6,690,557 B2 * 2/2004 Hung et al. .................... 361/56
6,730,968 B1 * 5/2004 Wu et al. ..................... 257/355

* cited by examiner

Primary Examiner—Brian Sircus
Assistant Examiner—James Demakis
(74) Attorney, Agent, or Firm—Birch, Stewart, Kolasch & Birch, LLP

(57) ABSTRACT

An ESD protection circuit with whole-chip ESD protection. A plurality of ESD protection devices, apart from an ESD detection circuit, can be MOS transistors connected between the input/output pads and the VDD/VSS lines or a power rail clamp circuit between the VDD and VSS lines. The ESD detection circuit is connected between the VDD and VSS lines. When an ESD event occurs and an ESD current is bypassed to the power line, the ESD detection circuit generates a plurality of enabling signals to simultaneously enable the ESD protection devices, which provides a plurality of discharge paths to bypass the ESD current.

17 Claims, 11 Drawing Sheets

ESD PROTECTION CIRCUIT WITH WHOLE-CHIP ESD PROTECTION

This nonprovisional application claims priority under 35 U.S.C. §119(a) on Patent Application No(s). 091111477 filed in TAIWAN on May 29, 2002, which is(are) herein incorporated by reference.

BACKGROUND OF THE INVENTION

1. Field of the Invention

The present invention relates to an electrostatic discharge (ESD) protection technology, more specifically, to an ESD protection circuit with whole-chip ESD protection, in which an ESD event can simultaneously conduct a plurality of discharge paths and the ESD current automatically leads to that with the lowest resistance to ground, preventing the ESD current from flowing into the internal circuit due to layout or the position shift of ESD devices caused by the manufacturing process.

2. Description of the Related Art

ESD phenomena have become a reliability issue in complementary metal oxide semiconductor (CMOS) integrated circuits (ICs) because of technology scaling and high frequency requirements. ESD events happen in various steps of the semiconductor process, such as manufacturing, packaging, shipping and assembly, and may cause damage to the semiconductor chips. Current ESD protection technology utilizes ESD protection circuits or devices close to input/output pads or internally within chips to reduce the possibility of ESD damage. There are four possible ESD-stress modes, described as follows:

(1) Positive-to-VSS (or PS) mode: ESD stress at a pad with positive voltage polarity with respect to the grounded VSS line when the VDD line and other input/output pads are floating;

(2) Negative-to-VSS (or NS) mode: ESD stress at a pad with negative voltage polarity with respect to the grounded VSS line when the VDD line and other input/output pads are floating;

(3) Positive-to-VDD (or PD) mode: ESD stress at a pad with positive voltage polarity with respect to the grounded VDD line when the VSS line and other input/output pads are floating; and (4) Negative-to-VDD (or ND) mode: ESD stress at a pad with negative voltage polarity with respect to the grounded VDD line when the VSS line and other input/output pads are floating.

The ESD protection circuit is designed to upgrade the immunity of semiconductor chips against these ESD stress modes. Several ESD protection circuits have been proposed and two MOS (Metal-Oxide-Semiconductor)-based ESD protection circuits are illustrated in the following description. One is an ESD protection circuit using gate-driven technique and another is an ESD protection circuit using substrate-triggering technique.

FIG. 1 (Prior Art) is a circuit diagram of a conventional ESD protection circuit using gate-driven technique. As shown in FIG. 1, the ESD protection circuit connected between input/output pad 100 and the VSS line includes an ESD detection circuit 200 and an NMOS transistor 300. NMOS transistor 300 is operated as an ESD protection device providing a discharge path. During normal operation, ESD detection circuit 200 does not output a bias voltage to the gate electrode of NMOS transistor 300 and NMOS transistor 300 is always turned off. When a PS-mode ESD event occurs at input/output pad 100, ESD detection circuit 200 outputs a bias voltage to the gate electrode of NMOS transistor 300 and drives the NMOS transistor 300 to enter snapback mode early to bypass the ESD current.

U.S. Pat. No. 5,717,560 and U.S. Pat. No. 5,910,874 illustrate two examples of the ESD protection circuits using gate-driven technique. In '560 patent, the ESD protection circuit has an NMOS transistor serving as an ESD protection device, which has a gate electrode connected to input/output pads. When an ESD event occurs, an ESD voltage is coupled to the gate electrode of the ESD protection device via coupling capacitance between the input/output pads and the VDD/VSS lines, thus turning on the ESD protection device to conduct ESD current. In '874 patent, the ESD protection circuit employs an inverter as an ESD detection circuit. When an ESD event occurs, it outputs a bias voltage for conducting the ESD protection device to bypass the ESD current.

FIG. 2 (Prior Art) is a circuit diagram of a conventional ESD protection circuit using substrate-triggering technique. The ESD protection circuit is also connected between input/output pad 110 and the VSS line, and comprises an ESD detection circuit 210 and an NMOS transistor 310. NMOS transistor 310 is operated as an ESD protection device providing a discharge path. The difference between the substrate-triggering scheme and the gate-driven scheme described above is the ESD detection circuit 210's utilization of a substrate-triggering current Ib to trigger the ESD protection device. During normal operation, ESD detection circuit 210 does not output the substrate-triggering current Ib to the substrate of NMOS transistor 310 and NMOS transistor 310 is, therefore, turned off. As a PS-mode ESD event occurs at input/output pad 110, ESD detection circuit 210 outputs the substrate-triggering current Ib to the substrate of NMOS transistor 310 and turns on a lateral npn bipolar junction transistor (BJT) of NMOS transistor 310 to enter snapback mode early to bypass the ESD current.

U.S. Pat. No. 5,744,842 and U.S. Pat. No. 6,072,219 illustrate two examples of the ESD protection circuits using substrate-triggering technique. In '842 patent, the ESD detection circuit is composed of an inverter, a resistor and a capacitor. In addition, the time constant of the RC circuit is designed to be substantially of the µs order to discriminate power-on events, which are substantially of the ms order, from ESD events, which are substantially of the ns order. Thus, the substrate-triggering current can be properly outputted to turn on field oxide devices (FODs) of ESD protection devices. During normal operation, the ESD detection circuit does not output the substrate-triggering current. When an ESD event occurs in the VDD line, the ESD detection circuit outputs the substrate-triggering current to the substrate of the FOD and triggers the parasitic npn BJT of the FOD to bypass ESD current. In '219 patent, the ESD protection circuit includes an ESD protection device and an ESD detection circuit, each of which consists of an NMOS transistor and a PMOS transistor. The transistors of the ESD detection circuit have lower trigger-on voltage and thus enter snapback mode early to introduce the substrate-triggering current into the substrate of the ESD protection circuit. Consequently, the parasitic BJT of the ESD protection device quickly turns on to bypass ESD current, thereby achieving ESD protection.

Conventional ESD protection circuits using gate-driven or substrate-triggering technique can effectively protect internal circuitry of the IC from ESD damage. In these conventional proposals, the ESD current is usually bypassed by a single discharge path, including one or more ESD protection devices. The conventional ESD protection scheme may not, however, work if the resistance of this single discharge path to ground is higher than that of the internal circuitry due to layout or the position shift of ESD devices caused by the manufacturing process since the ESD current always flows into the ground via the path having the lowest resistance to ground.

SUMMARY OF THE INVENTION

Accordingly, the object of the present invention is to provide an ESD protection circuit with whole-chip ESD protection which can provide a plurality of discharge paths as an ESD event occurs. The ESD current can be automatically bypassed through the discharge path with the lowest resistance to ground, thereby preventing the ESD current from contact with and subsequent damage to the internal circuitry.

In a preferred embodiment, the present invention provides an ESD protection circuit with whole-chip ESD protection, which comprises a plurality of ESD protection devices and an ESD detection circuit. These ESD protection devices may be PMOS transistors connected between the input/output pads and the VDD line, NMOS transistors connected between the input/output pads and the VSS line or the power rail clamp circuit between the VDD and VSS lines. The ESD detection circuit is connected between the VDD and VSS lines. When an ESD event occurs in the input/output pads and an ESD current is bypassed to one of the VDD and VSS lines, the ESD detection circuit generates a plurality of enabling signals to enable these ESD protection devices for further bypassing the ESD current. The enabling signal can be a substrate-triggering signal or a gate-driven signal.

The ESD detection circuit comprises a resistor and a capacitor serially connected. The time constant of the RC circuit can differentiate between ESD events and power-on events. In addition, the ESD detection circuit also comprises a MOS transistor for detecting the ESD current, which has a gate electrode connected to a contact node of the resistor and the capacitor, a source electrode connected to the VDD or VSS line, and a drain electrode for outputting the enabling signals. If the MOS transistor in the ESD detection circuit is a PMOS transistor, the enabling signals enable NMOS transistors of these ESD protection devices. If the MOS transistor in the ESD detection circuit is an NMOS transistor, the enabling signals enable PMOS transistors of these ESD protection devices.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In the ESD protection circuit with whole-chip ESD protection in the present invention, the ESD detection circuit can simultaneously enable a plurality of ESD discharge paths when an ESD event occurs. Thus, the ESD current selectively flows into the path with the lowest resistance to ground, thereby avoiding contact with and subsequent damage to the internal circuitry. In the following description, seven embodiments of the ESD protection circuits in accordance with the present invention are illustrated, which include:

1. An ESD protection circuit using whole-chip NMOS substrate-triggering technique;

2. An ESD protection circuit using whole-chip PMOS substrate-triggering technique;

3. An ESD protection circuit using whole-chip substrate-triggering technique;

4. An ESD protection circuit using whole-chip NMOS gate-driven technique;

5. An ESD protection circuit using whole-chip PMOS gate-driven technique;

6. An ESD protection circuit using whole-chip gate-driven technique; and

7. An ESD protection circuit using whole-chip gate-driven technique applied in output pads.

Figure 1:
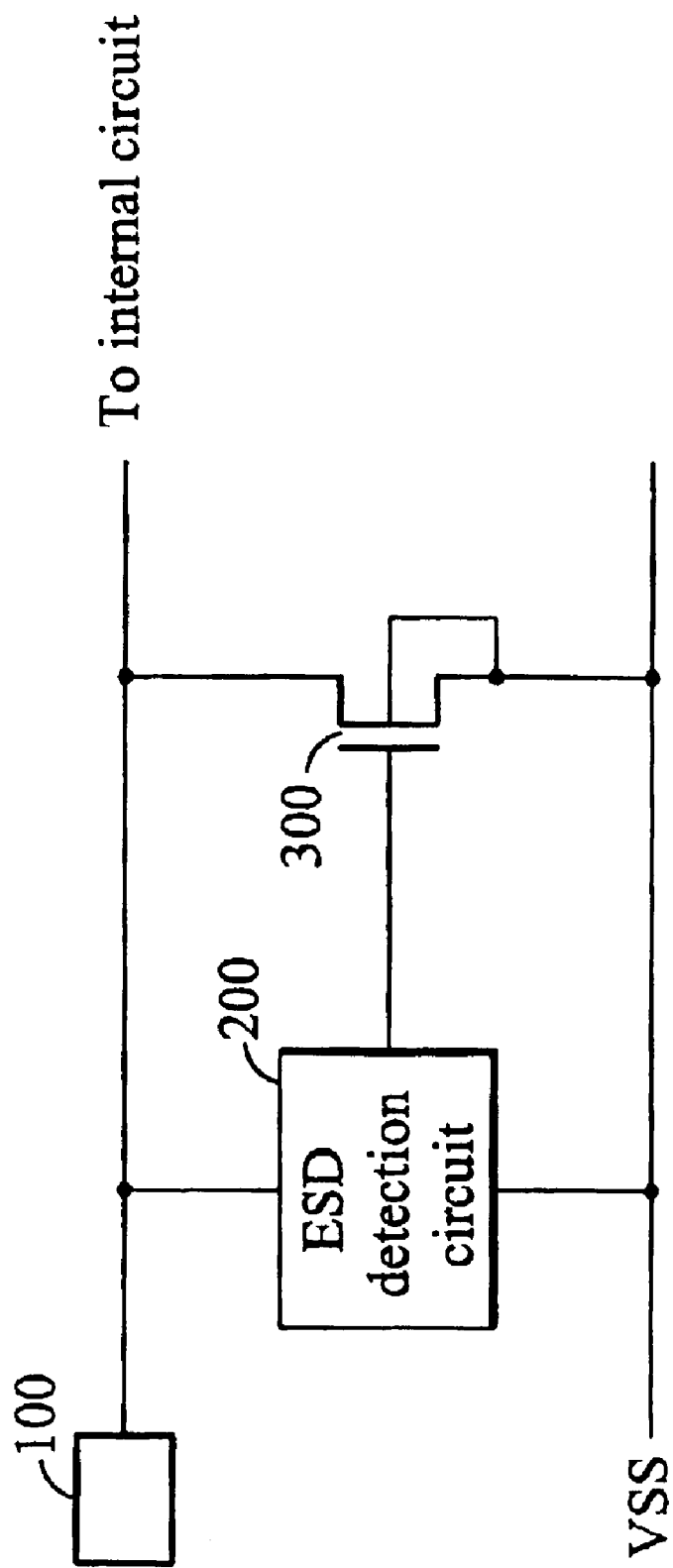
FIG. 1 (Prior Art) is a circuit diagram of a conventional ESD protection circuit using gate-driven technique.
Figure 2:
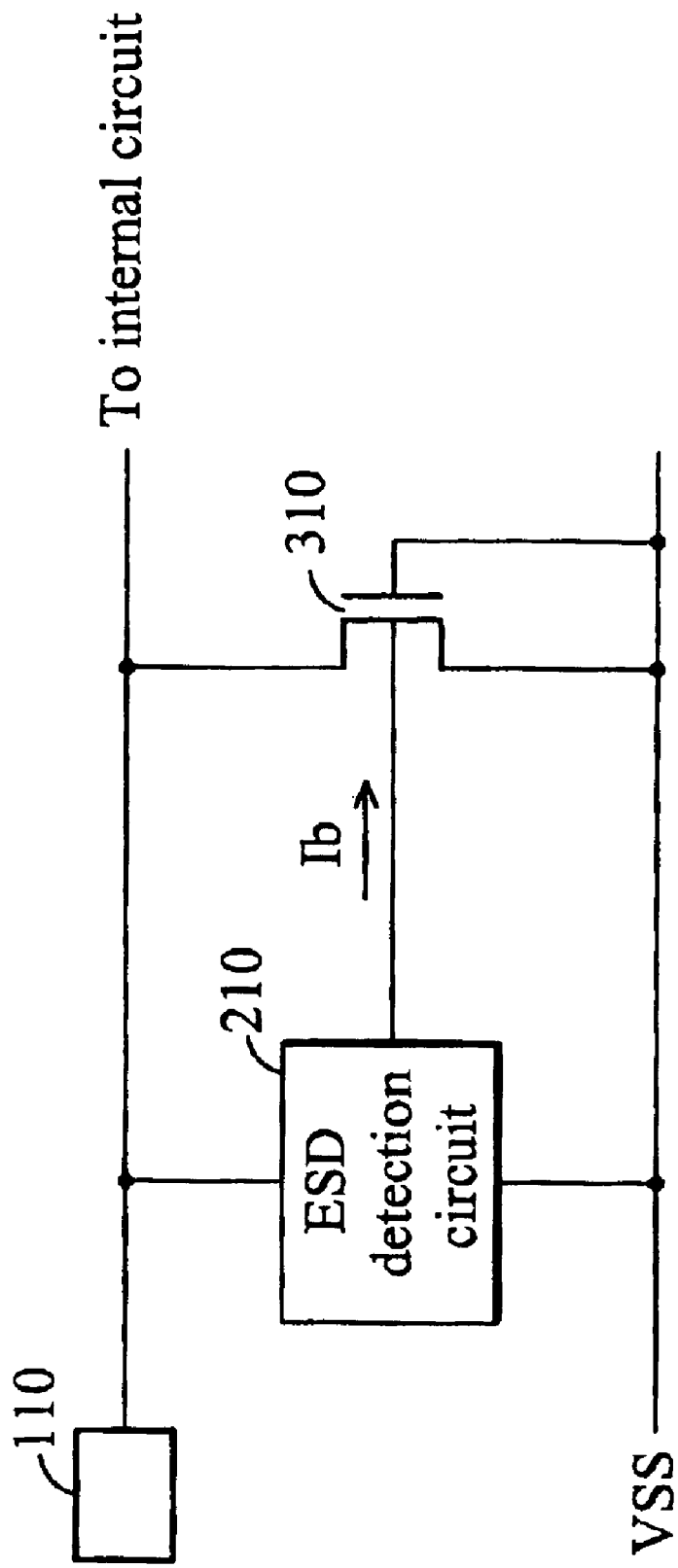
FIG. 2 (Prior Art) is a circuit diagram of a conventional ESD protection circuit using substrate-triggering technique.
Figure 3:
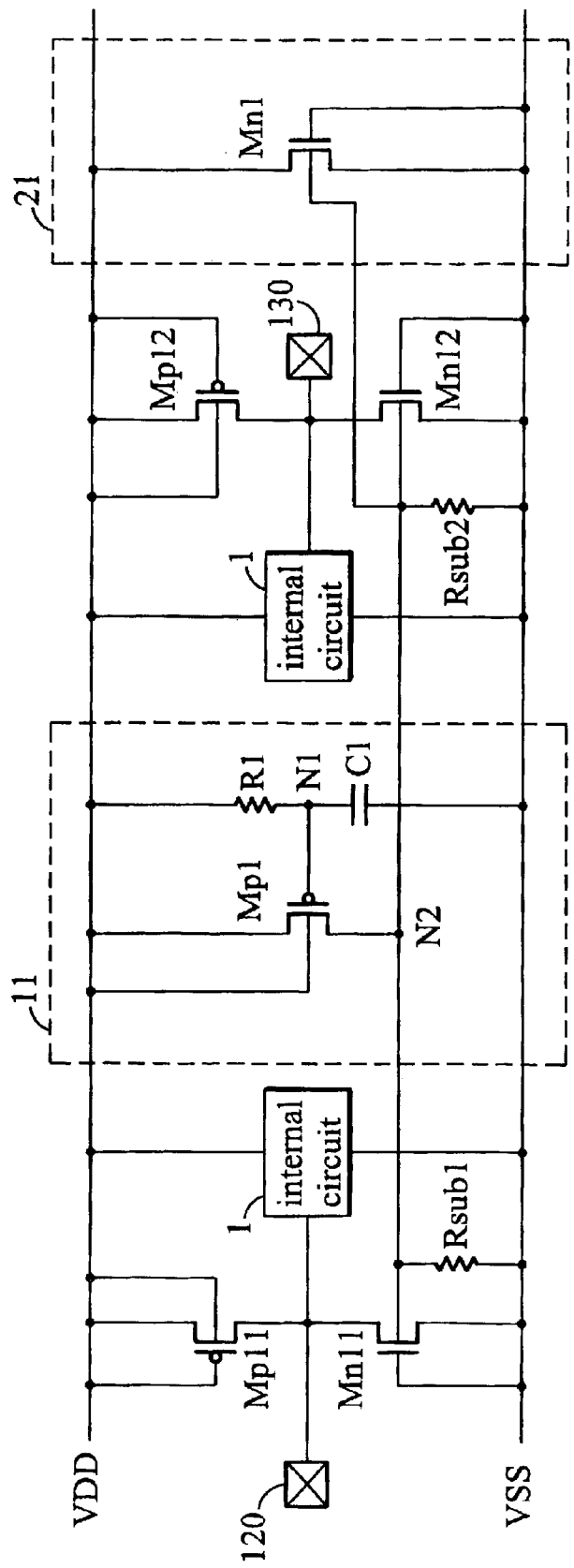
FIG. 3 is a circuit diagram of the ESD protection circuit using a whole-chip NMOS substrate-triggering technique in accordance with the first embodiment of the present invention.

First Embodiment:

FIG. 3 is a circuit diagram of the ESD protection circuit using whole-chip NMOS substrate-triggering technique in accordance with the present embodiment. The integrated circuit shown in FIG. 3 has input pads 120 and 130 connected to internal circuit 1. The ESD protection circuit shown in FIG. 3 comprises an ESD detection circuit 11 and several ESD protection devices located between input pads 120 and 130 and the VDD and VSS lines. These ESD protection devices include NMOS transistors Mp11 and Mn11 connected between input pad 120 and the VDD and VSS lines, MOS transistors Mp12 and Mn12 connected between input pad 130 and the VDD/VSS lines and a power rail clamp circuit 21 comprising NMOS transistor Mn1. In addition, resistors Rsub1 and Rsub2 represent the parasitic substrate resistors with respect to NMOS transistors Mn11 and Mn12, respectively.

ESD detection circuit 11 connected between the VDD and VSS lines produces substrate-triggering signals (enabling signals) to turn on the NMOS transistors serving as an ESD protection devices when an ESD event occurs, thereby enabling more than one ESD discharge path. As shown in FIG. 3, ESD detection circuit 11 includes a resistor R1, a capacitor C1 and a PMOS transistor Mp1 for ESD detection. Resistor R1 and capacitor C1 are serially connected between the VDD and VSS lines. PMOS transistor Mp1 has a gate electrode connected to a contact node (node N1) of resistor R1 and capacitor C1, a drain electrode (node N2) connected to the substrates of NMOS transistors Mn11, Mn12 and Mn1 serving as an ESD protection devices, and source and substrate electrodes connected to the VDD line. ESD detection circuit 11 outputs the substrate-triggering signals via node N2 to turn on these ESD protection devices.

Since ESD detection circuit 11 cannot affect the normal operation of the internal circuit and rapidly outputs the substrate-triggering signals to turn on the ESD protection devices (NMOS transistors) to bypass ESD current during an ESD events, the time constant of the RC circuit of ESD detection circuit 11 is an important parameter in circuit design. Generally speaking, the rising time of the ESD transient voltage is about 5~15 ns, and the power-on time of the integrated circuit is is substantially of the ms order. Thus, in the present embodiment, the time constant is preferably designed to be about 0.1~1.0 $\mu$s, able to differentiate between ESD events and power-on events in ESD detection circuit 11.

The operation of the ESD protection circuit in the present embodiment is described as follows with respect to the four ESD-stress modes.

PS-mode ESD

When a PS-mode ESD event occurs in input pad 120, part of the ESD current is bypassed to the VDD line because the parasitic diode of PMOS transistor Mp11 is forward-biased with respect to PS-mode ESD. At this time, in ESD detection circuit 11, the voltage of node N1 or the gate electrode of MOS transistor Mp1 is the same as that of the VSS line due to the deferral of voltage change caused by capacitor C1 of the RC circuit. Thus, the transient voltage of the source electrode of MOS transistor Mp1, namely the voltage of the VDD line, is higher than that of its gate electrode. MOS transistor Mp1 is, therefore, turned on and thus the ESD current flows from the VDD line to the VSS line through MOS transistor Mp1 and substrate resistors Rsub1 and Rsub2. Voltage drop caused by the ESD current through substrate resistors Rsub1 and Rsub2 can expedite conduction of lateral npn BJTs of NMOS transistors Mn11, Mn12 and Mn1. Thus, there are two candidates to bypass the ESD current from input pad 120 to the VSS line. The first is the discharge path constituted by PMOS transistor Mp11 and NMOS transistor Mn1 of power rail clamp circuit 21. The second is the discharge path constituted by only NMOS transistor Mn11. The practical discharge path of the ESD current is determined by the resistance to ground.

NS-mode ESD

When an NS-mode ESD event occurs in input pad 120, the parasitic diode of NMOS transistor Mn11 is forward-biased to bypass the negative ESD current to the VSS line for ESD protection.

PD-mode ESD

When a PD-mode ESD event occurs in input pad 120, the parasitic diode of PMOS transistor Mp11 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn11 is forward-biased with respect to ND-mode ESD. In ESD detection circuit 11, the voltage of node N1 is the same as that of the VSS line since the transient voltage of the VSS line is directly coupled to node N1 via the capacitor C1 of the RC circuit. Thus, at this time, the voltage of the gate electrode of MOS transistor Mp1 is equal to the transient negative ESD voltage plus the voltage of the VSS line. The voltage of the source electrode of MOS transistor Mp1 is higher than that of its gate electrode and MOS transistor Mp1 is turned on. The negative ESD current flows from the VSS line to the VDD line through MOS transistor Mp1 and substrate resistors Rsub1 and Rsub2. Voltage drop caused by the negative ESD current through substrate resistors Rsub1 and Rsub2 can expedite conduction of lateral npn BJTs of NMOS transistors Mn11, Mn12 and Mn1. The ESD current can be, therefore, discharged through NMOS transistor Mn11 and NMOS transistor Mn1 of power rail clamp circuit 21 to achieve ESD protection.

Accordingly, the ESD protection circuit using whole-chip NMOS substrate-triggering technique of the present embodiment can simultaneously enable at least two different ESD discharge paths when a PS-mode ESD event occurs in the input pad. The ESD current is selectively bypassed through that with the lowest resistance to ground, thereby avoiding the ESD current accidentally flowing into the internal circuit due to layout or the position shift of the ESD devices.

Figure 4:
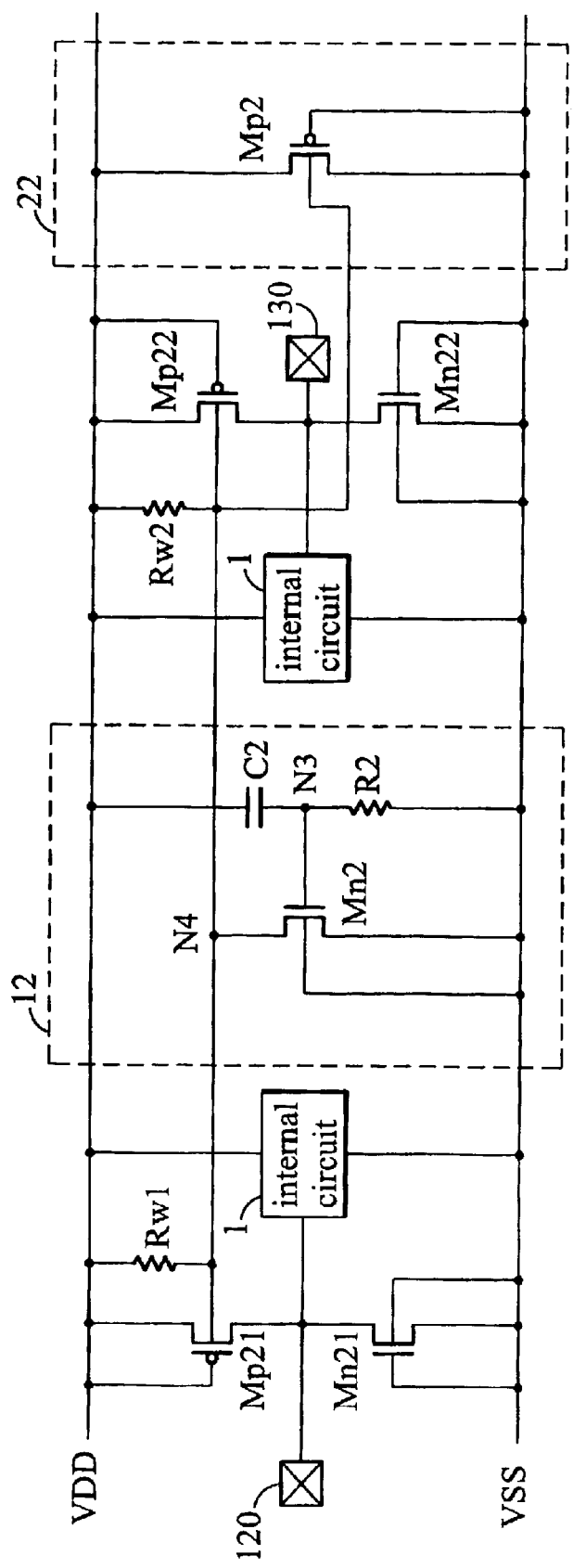
FIG. 4 is a circuit diagram of the ESD protection circuit using a whole-chip PMOS substrate-triggering technique in accordance with the second embodiment of the present invention.

Second Embodiment:

FIG. 4 is a circuit diagram of the ESD protection circuit using whole-chip PMOS substrate-triggering technique in accordance with the present embodiment. The ESD protection circuit shown in FIG. 4 comprises an ESD detection circuit 12 and several ESD protection devices connected between input pads 120 and 130 and the VDD and VSS lines. These ESD protection devices include MOS transistors Mp21 and Mn21 connected between input pad 120 and the VDD and VSS lines, MOS transistors Mp22 and Mn22 connected between input pad 130 and the VDD and VSS lines and a power rail clamp circuit 22 comprising PMOS transistor Mp2. In addition, resistors Rw1 and Rw2 represent the parasitic N-well resistors with respect to PMOS transistors Mp21 and Mp22, respectively.

ESD detection circuit 12 is also connected between the VDD and VSS lines and outputs substrate-triggering signals (enabling signals) to turn on PMOS transistors serving as an ESD protection device, thereby providing more than one discharge path when an ESD event occurs. ESD detection circuit 12, slightly different from that of the first embodiment, includes a resistor R2, a capacitor C2 and an NMOS transistor Mn2. Resistor R2 and capacitor C2 are serially connected between the VDD and VSS lines, where resistor R2 is connected to the VSS line and capacitor C2 is connected to the VDD line. NMOS transistor Mn2 for ESD detection has a gate electrode connected to a contact node (node N3) of resistor R2 and capacitor C2, a drain electrode (node N4) coupled to the substrates of PMOS transistors Mp21, Mp22 and Mp2, and source and substrate electrodes connected to the VSS line. ESD detection circuit 12 outputs the substrate-triggering signals via node N4 to turn on these ESD protection devices.

Since ESD detection circuit 12 cannot affect the normal operation of the internal circuit and rapidly outputs the substrate-triggering signals to turn on the ESD protection devices during an ESD event, the time constant of the RC circuit of ESD detection circuit 12 is preferably designed to be about 0.1~1.0 $\mu$s, able to differentiate between ESD events and power-on events in ESD detection circuit 12.

The operation of the ESD protection circuit shown in FIG. 4 is described as follows with respect to the four ESD-stress modes.

PS-mode ESD

When a PS-mode ESD event occurs in input pad 120, part of the ESD current is bypassed to the VDD line because the parasitic diode of the PMOS transistor Mp21 is forward-biased with respect to PS-mode ESD. At this time, in ESD detection circuit 12, the voltage of node N3 or the gate electrode of NMOS transistor Mn2 is the same as that of the VDD line since the voltage of the VDD line is directly coupled to node N3 via capacitor C2 of the RC circuit. Thus, the transient voltage of the gate electrode of NMOS transistor Mn2 is higher than that of its source electrode, equal to the voltage of the VSS line. NMOS transistor Mn2 is, therefore, turned on and the ESD current flows from the VDD line to the VSS line through N-well resistors Rw1 and Rw2. Voltage drop caused by the ESD current through N-well resistors Rw1 and Rw2 can expedite conduction of lateral pnp BJTs of PMOS transistors Mp21, Mp22 and Mp2. The ESD current is discharged through PMOS transistor Mp21 and PMOS transistor Mp2 of power rail clamp circuit 22 to achieve ESD protection.

NS-mode ESD

When an NS-mode ESD event occurs in input pad 120, the parasitic diode of NMOS transistor Mn21 is forward-biased to bypass the negative ESD current to the VSS line for ESD protection.

PD-mode ESD

When a PD-mode ESD event occurs in input pad 120, the parasitic diode of PMOS transistor Mp21 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn21 is forward-biased with respect to ND-mode ESD. At this time, in ESD detection circuit 12, the transient voltage of node N3 or the gate electrode of MOS transistor Mn2 is the same as that of the VDD line due to the deferral of voltage change caused by capacitor C2 of the RC circuit. Thus, the voltage of the gate electrode of NMOS transistor Mn2 is higher than that of its source electrode. NMOS transistor Mn2 is, therefore, turned on and the negative ESD current flows from the VSS line to the VDD line through N-well resistors Rw1 and Rw2. Voltage drop caused by the negative ESD current through N-well resistors Rw1 and Rw2 can expedite conduction of lateral pnp BJTs of PMOS transistors Mp21, Mp22 and Mp2. Thus, there are two candidates to bypass the ESD current from input pad 120 to the VDD line. The first is the discharge path constituted by NMOS transistor Mn21 and PMOS transistor Mp2 of the power rail clamp circuit 22. The second is the discharge path constituted by only PMOS transistor Mp21. The practical discharge path of the ESD current is determined by the resistance to ground.

Accordingly, the ESD protection circuit using whole-chip PMOS substrate-triggering technique of the present embodiment can enable at least two different ESD discharge paths when a ND-mode ESD event occurs in the input pad. The ESD current is selectively bypassed through that with the lowest resistance to ground, thereby avoiding the ESD current accidentally flowing into the internal circuit due to layout or position shift of ESD devices during manufacture.

Figure 5:
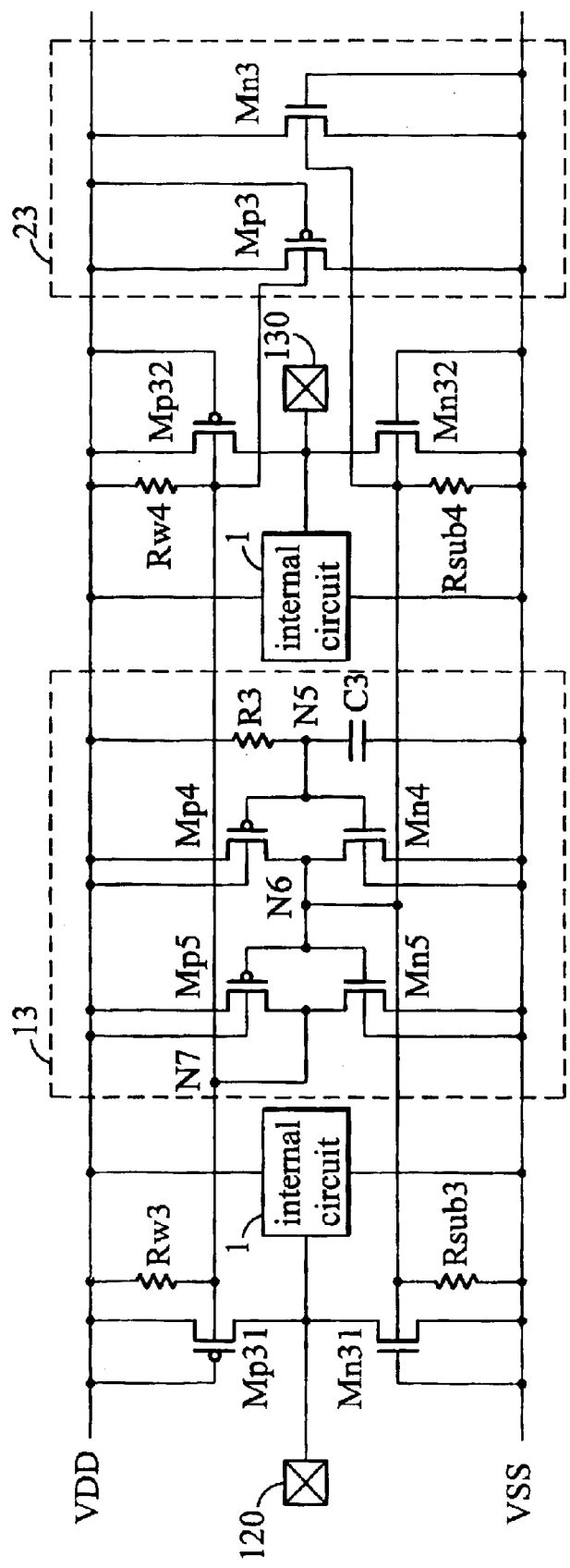
FIG. 5 is a circuit diagram of the ESD protection circuit using a whole-chip substrate-triggering technique in accordance with the third embodiment of the present invention.

Third Embodiment:

In the first and second embodiments, only NMOS transistors or PMOS transistors are utilized to achieve ESD protection. In the present embodiment, both PMOS and NMOS transistors with a substrate-triggering configuration are employed to achieve ESD protection. FIG. 5 is a circuit diagram of the ESD protection circuit using whole-chip substrate-triggering technique in accordance with the present embodiment. The ESD protection circuit shown in FIG. 5 comprises an ESD detection circuit 13 and several ESD protection devices connected between input pads 120 and 130 and the VDD and VSS lines. These ESD protection devices include MOS transistors Mp31 and Mn31 connected between input pad 120 and the VDD and VSS lines, MOS transistors Mp32 and Mn32 connected between input pad 130 and the VDD and VSS lines and a power rail clamp circuit 23 comprising an NMOS transistor Mn3 and a PMOS transistor Mp3. In addition, resistors Rsub3 and Rsub4 shown in FIG. 5 represent the parasitic substrate resistors with respect to NMOS transistors Mn31 and Mn32, and resistors Rw3 and Rw4 represent the parasitic N-well resistors with respect to PMOS transistors Mp31 and Mp32, respectively.

ESD detection circuit 13 is also located between the VDD and VSS lines and outputs substrate-triggering signals (enabling signals) to turn on ESD devices of the ESD protection circuit to enable more than one discharge path when an ESD event occurs. The ESD detection circuit 13, different from those of the first and second embodiments, includes a resistor R3, a capacitor C3, a first inverter constituted by MOS transistors Mn4 and Mp4 and a second inverter constituted by MOS transistors Mn5 and Mp5. Resistor R3 is connected to the VDD line and capacitor C3 is connected to the VSS line. The first inverter has an input node N5, namely the gates of MOS transistors Mp4 and Mn4, connected to the contact node of resistor R3 and capacitor C3 and an output node N6 connected to the substrates of the NMOS transistors serving as an ESD protection devices, including NMOS transistors Mn31, Mn32 and Mn3. In addition, the second inverter has an input node, namely the gates of transistor Mn5 and Mp5, connected to the output node N6 of the first inverter and an output node N7 connected to the substrates of the PMOS transistors serving as an ESD protection devices, including PMOS transistors Mp31, Mp32 and Mp3. Briefly speaking, the ESD detection circuit 13 outputs a first set of the substrate-triggering signals from node N6 to trigger the NMOS transistors of the ESD protection devices, and a second set of the substrate-triggering signals from node N7 to trigger the PMOS transistors of the ESD protection devices. Similarly, the time constant of the RC circuit of the ESD detection circuit 13 is preferably designed to be about 0.1~1.0 $\mu$s, able to differentiate between ESD events and power-on events in ESD detection circuit 13.

The operation of the ESD protection circuit shown in FIG. 5 is described as follows with respect to the four ESD-stress modes.

PS-mode ESD

When a PS-mode ESD event occurs in input pad 120, part of the ESD current is bypassed to the VDD line because the parasitic diode of the PMOS transistor Mp31 is forward-biased with respect to PS-mode ESD. At this time, in ESD detection circuit 13, the voltage of node N5 or the gate electrodes of MOS transistors Mp4 and Mn4 in the first inverter is the same as that of the VSS line due to the deferral of voltage change caused by capacitor C3 of the RC circuit. Thus, PMOS transistor Mp4 is turned on since its source voltage is higher than its gate voltage. As well, NMOS transistor Mn4 is turned off since its source and gate voltages are the same. Thus, the ESD current flows from the VDD line to the VSS line through PMOS transistor Mp4 and substrate resistors Rsub3 and Rsub4. Voltage drop caused by the ESD current through substrate resistors can expedite conduction of lateral npn BJTs of NMOS transistors Mn31, Mn32 and Mn3. Next, the voltage of node N6 is increased. NMOS transistor Mn5 is turned on since its gate voltage is higher than its source voltage. As well, PMOS transistor Mp5 is turned off since its source and gate voltages are the same. Thus, the ESD current flows from the VDD line to the VSS line through NMOS transistors Mn5 and N-well resistors Rw3 and Rw4. Voltage drop caused by the ESD current through N-well resistors can also expedite conduction of lateral pnp BJTs of PMOS transistors Mp31, Mp32 and Mp3.

In conclusion, there are four candidates to bypass the PS-mode ESD current from input pad 120 to the VSS line. The first is the discharge path constituted by PMOS transistor Mp31 and PMOS transistor Mp3 of the power rail clamp circuit 23. The second is the discharge path constituted by only NMOS transistor Mn31. The third is the discharge path constituted by PMOS transistor Mp31, PMOS is transistor Mp32 and NMOS transistor Mn32. The fourth is the discharge path constituted by PMOS transistor Mp31 and NMOS transistor Mn3 of the power rail clamp circuit 23. The practical discharge path of the ESD current is determined by the resistance to ground.

NS-mode ESD

When an NS-mode ESD event occurs in input pad 120, the parasitic diode of NMOS transistor Mn31 is forward-biased to bypass the negative ESD current to the VSS line for ESD protection.

PD-mode ESD

When a PD-mode ESD event occurs in input pad 120, the parasitic diode of PMOS transistor Mp31 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn31 is forward-biased with respect to ND-mode ESD. At this time, in ESD detection circuit 13, the voltage of node N5 or the gate electrodes of MOS transistor Mp4 and Mn4 in the first inverter is equal to the voltage of the VSS line plus the transient ESD voltage due to the coupling effect of capacitor C3 of the RC circuit. Thus, PMOS transistor Mp4 is turned on since its source voltage is higher than its gate voltage. As well, NMOS transistor Mn4 is turned off since its source and gate voltages are the same. Thus, the negative ESD current flows from the VSS line to the VDD line through PMOS transistor Mp4 and substrate resistors Rsub3 and Rsub4. Voltage drop caused by the negative ESD current through substrate resistors can expedite conduction of lateral npn BJTs of NMOS transistors Mn31, Mn32 and Mn3. Therefore, the voltage of node N6 is the same as that of the VDD line. NMOS transistor Mn5 is turned on since its gate voltage is higher than its source voltage. As well, PMOS transistor Mp5 is turned off since its source and gate voltages are the same. Thus, the negative ESD current flows from the VSS line to the VDD line through N-well resistors Rw3 and Rw4. Voltage drop caused by the ESD current through N-well resistors can also expedite conduction of lateral pnp BJTs of PMOS transistors Mp31, Mp32 and Mp3.

In conclusion, there are four candidates to bypass the ND-mode ESD current from input pad 120 to the VDD line. The first is the discharge path constituted by NMOS transistor Mn31 and PMOS transistor Mp3 of the power rail clamp circuit 23. The second is the discharge path constituted by only PMOS transistor Mp31. The third is the discharge path constituted by NMOS transistor Mn31, NMOS transistor Mn32 and PMOS transistor Mp32. The fourth is the discharge path constituted by NMOS transistor Mn31 and NMOS transistor Mn3 of the power rail clamp circuit 23. The practical discharge path of the ESD current is determined by the resistance to ground.

Accordingly, the ESD protection circuit using whole-chip substrate triggering technique of the present embodiment can enable at least four different ESD discharge paths when a PS-mode or ND-mode ESD event occurs in the input pad. The ESD current is selectively bypassed through that with the lowest resistance to ground, thereby avoiding the ESD current accidentally flowing into the internal circuit due to layout or position shift of ESD devices during manufacture.

Figure 6:
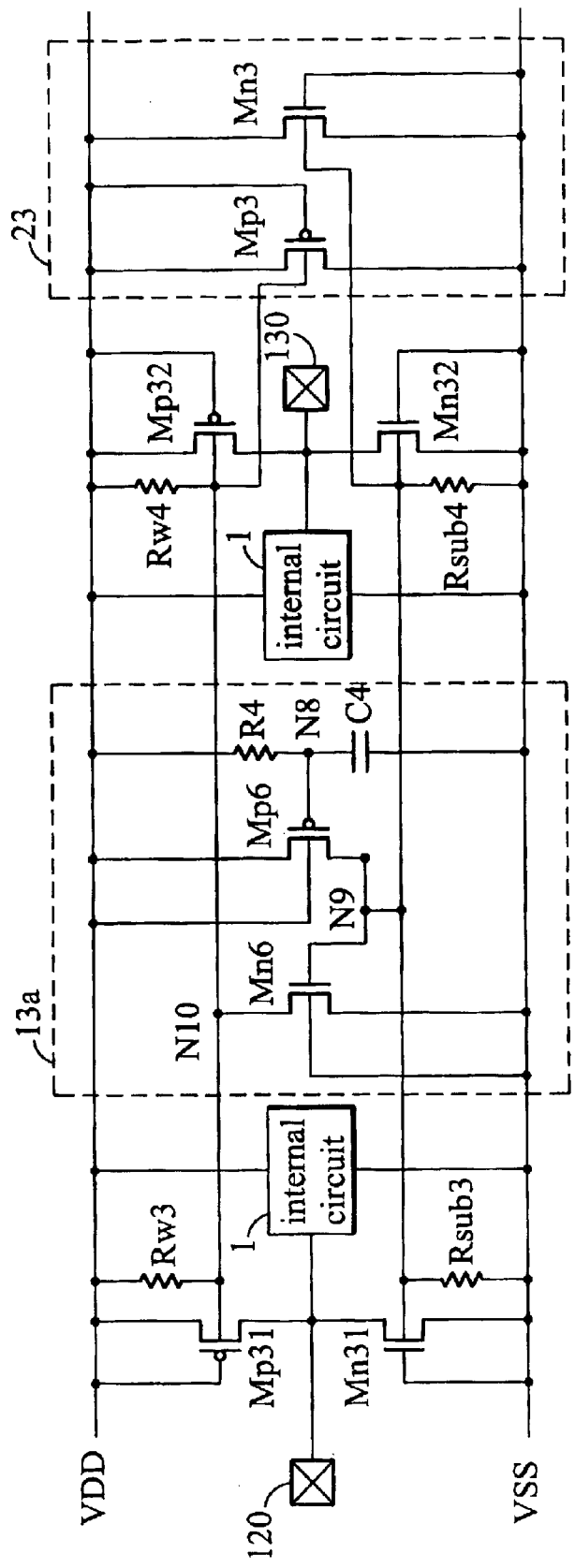
FIG. 6 is a circuit diagram of another example of the ESD protection circuit using a whole-chip substrate-triggering technique in accordance with the third embodiment of the present invention.

FIG. 6 is a circuit diagram of another example of the ESD protection circuit using whole-chip substrate-triggering technique in accordance with the present embodiment, different from that of the ESD protection circuit shown in FIG. 5 in the circuit design of the ESD detection circuit. As shown in FIG. 6, the ESD detection circuit 13a comprises a resistor R4, a capacitor C4, a PMOS transistor Mp6 and an NMOS transistor Mn6. PMOS transistor Mp6 has a gate electrode (node N8) connected to the contact node of the resistor R4 and the capacitor C4, source and substrate electrodes connected to the VDD line, and a drain electrode (node N9) connected to the substrates of NMOS transistors of the ESD protection devices, including NMOS transistors Mn31, Mn32 and Mn3. NMOS transistor Mn6 has a gate electrode connected to node N9, source and substrate electrodes coupled to the VSS line and a drain electrode (node N10) connected to the substrates of PMOS transistors of the ESD protection devices, including PMOS transistors Mp31, Mp32 and Mp3.

The operation of the ESD detection circuit 13a shown in FIG. 6 is basically the same as that of the ESD detection circuit 13 shown in FIG. 5. The advantage of such circuit design is that fewer electronic components are involved and more layout space is reserved.

Fourth Embodiment:

The first to third embodiments utilize the whole-chip substrate-triggering technique to design the ESD protection circuit, but the present embodiment and those following utilize the whole-chip gate-driven technique to achieve ESD protection.

Figure 7:
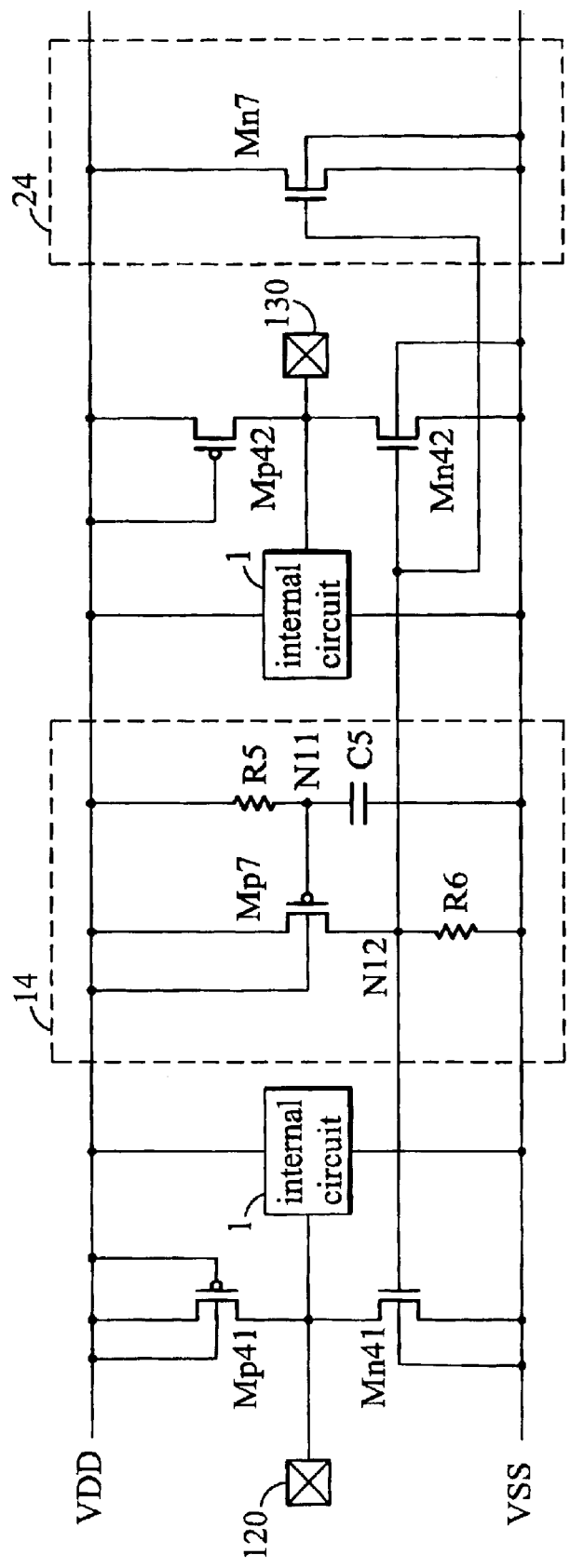
FIG. 7 is a circuit diagram of the ESD protection circuit using a whole-chip NMOS gate-driven technique in accordance with the fourth embodiment of the present invention.

FIG. 7 is a circuit diagram of the ESD protection circuit using whole-chip NMOS gate-driven technique in accordance with the present embodiment. Input pads 120 and 130 connected to internal circuit 1 illustrate the operation of ESD protection. The ESD protection circuit shown in FIG. 7 comprises an ESD detection circuit 14 and several ESD protection devices connected between input pads 120 and 130 and the VDD and VSS lines. These ESD protection devices include MOS transistors Mp41 and Mn41 connected between input pad 120 and the VDD and VSS lines, MOS transistors Mp42 and Mn42 connected between input pad 130 and the VDD/VSS lines and a power rail clamp circuit 24 comprising NMOS transistor Mn7.

ESD detection circuit 14 located between the VDD and VSS lines transmits several gate-driven signals (enabling signals) to the NMOS transistors serving as an ESD protection devices when an ESD event occurs, thereby simultaneously enabling more than one ESD discharge path. As shown in FIG. 7, ESD detection circuit 14 includes a resistor R5, a capacitor C5, a PMOS transistor Mp7 for ESD detection and a resistor R6 connected to the drain electrode of PMOS transistor Mp7. Resistor R5 and capacitor C5 are serially connected between the VDD and VSS lines, where resistor R5 is connected to the VDD line and the capacitor C5 is connected to the VSS line. PMOS transistor Mp7 has a gate electrode (node N11) connected to the contact node between resistor R5 and capacitor C5, source and substrate electrodes connected to the VDD line and a drain electrode (node N12) connected to resistor R6 and the gate electrodes of NMOS transistors Mn41, Mn42 and Mn7 serving as an ESD protection devices. Resistor R6 serves as a load resistor for producing voltage drop as the ESD current passes. ESD detection circuit 14 transmits the gate-driven signal via node N12 to trigger these ESD protection devices. In addition, the time constant of the RC circuit of the ESD detection circuit 14 is preferably designed to be about 0.1~1.0 $\mu s$, able to differentiate between ESD events and power-on events in ESD detection circuit 14.

The operation of the ESD protection circuit in the present embodiment is described as follows with respect to the four ESD-stress modes.

PS-mode ESD

When a PS-mode ESD event occurs in input pad 120, part of the ESD current is bypassed to the VDD line because the parasitic diode of the PMOS transistor Mp41 is forward-biased with respect to PS-mode ESD. At this time, in ESD detection circuit 14, the voltage of node N11 or the gate electrode of PMOS transistor Mp7 is the same as that of the VSS line due to the deferral of voltage change caused by capacitor C5 of the RC circuit. Thus, the source voltage of MOS transistor Mp7, the same as the voltage of the VDD line plus the transient ESD voltage, is higher than its gate voltage. MOS transistor Mp7 is, therefore, turned on and the ESD current flows from the VDD line to the VSS line through PMOS transistor Mp7 and the load resistor R6. Voltage drop caused by the ESD current through resistor R6 can help to turn on NMOS transistors Mn41, Mn42 and Mn7. Thus, there are two candidates to bypass the ESD current from input pad 120 to the VSS line. The first is the discharge path constituted by PMOS transistor Mp41 and NMOS transistor Mn7 of the power rail clamp circuit 24. The second is the discharge path constituted by only NMOS transistor Mn41. The practical discharge path of the ESD current is determined by the resistance to ground.

NS-mode ESD

When an NS-mode ESD event occurs in input pad 120, the parasitic diode of NMOS transistor Mn41 is forward-biased to bypass the negative ESD current to the VSS line for ESD protection.

PD-mode ESD

When a PD-mode ESD event occurs in input pad 120, the parasitic diode of PMOS transistor Mp41 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn41 is forward-biased with respect to ND-mode ESD. In ESD detection circuit 14, the voltage of node N11 is the same as that of the VSS line since the voltage of the VSS line is coupled to node N11 via the capacitor C5 of the RC circuit. In other words, the gate voltage of PMOS transistor Mp7 is equal to the voltage of the VDD line plus the transient negative ESD voltage. The source voltage of PMOS transistor Mp7 is, therefore, higher its gate voltage and PMOS transistor Mp7 is turned on. Thus, the ESD current flows from the VSS line to the VDD line through PMOS transistor Mp7 and load resistor R6. Voltage drop caused by the negative ESD current through the load resistor R6 can help to turn on NMOS transistors Mn41, Mn42 and Mn7. The ESD current 120 can be, therefore, discharged through NMOS transistor Mn41 and NMOS transistor Mn7 of power rail clamp circuit 24 to achieve ESD protection.

Accordingly, the ESD protection circuit using whole-chip NMOS gate-driven technique of the present embodiment can enable at least two different ESD discharge paths when a PS-mode ESD event occurs in the input pad. The ESD current is selectively bypassed through that with the lowest resistance to ground, thereby avoiding the ESD current accidentally flowing into the internal circuit due to layout or position shift of ESD devices during manufacture.

Figure 8:
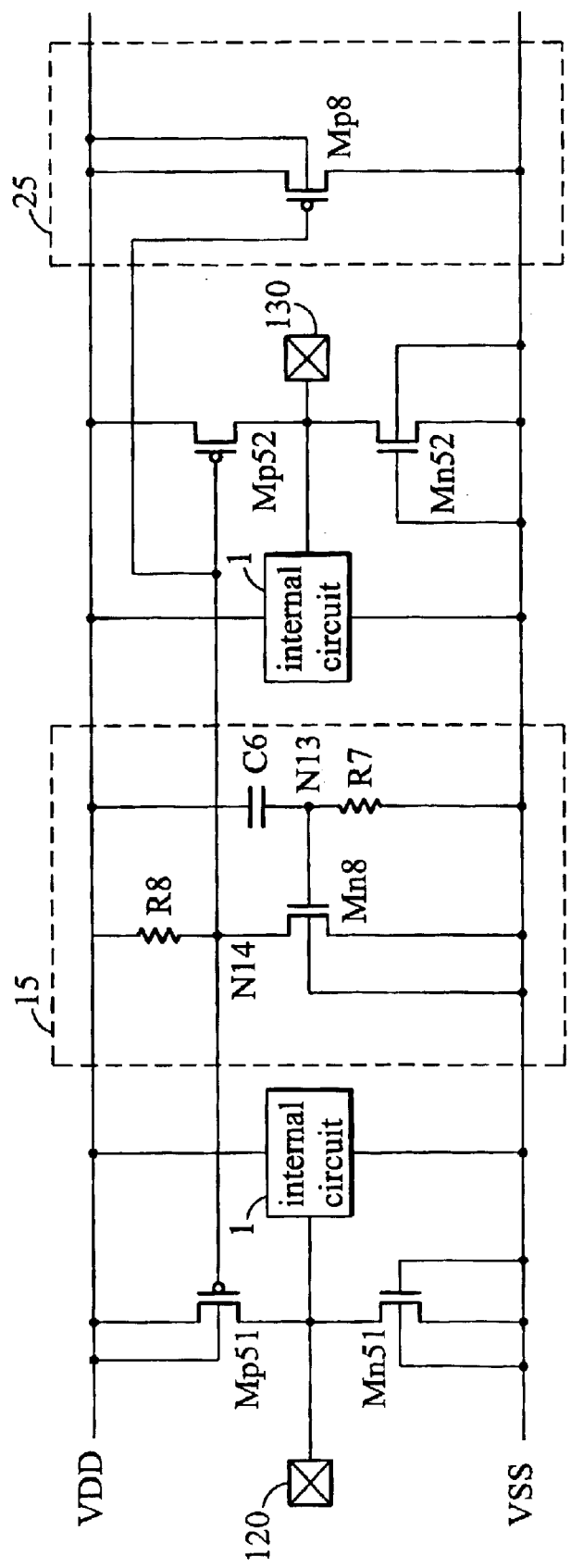
FIG. 8 is a circuit diagram of the ESD protection circuit using a whole-chip PMOS gate-driven technique in accordance with the fifth embodiment of the present invention.

Fifth Embodiment:

FIG. 8 is a circuit diagram of the ESD protection circuit using whole-chip PMOS gate-driven technique in accordance with the present embodiment. The ESD protection circuit shown in FIG. 8 comprises an ESD detection circuit 15 and several ESD protection devices located between input pads 120 and 130 and the VDD and VSS lines. These ESD protection devices include MOS transistors Mp51 and Mn51 connected between input pad 120 and the VDD and VSS lines, MOS transistors Mp52 and Mn52 connected between input pad 130 and the VDD and VSS lines and a power rail clamp circuit 25 comprising PMOS transistor Mp8.

Similarly, ESD detection circuit 15 is also located between the VDD and VSS lines and transmits gate-driven signals (enabling signals) to the PMOS transistors of the ESD protection devices, thereby simultaneously enabling more than one discharge path when an ESD event occurs. The ESD detection circuit 15 includes a resistor R7, a capacitor C6, an NMOS transistor Mn8 and a load resistor R8. Resistor R7 and capacitor C6 are serially connected between the VDD and VSS lines, where resistor R7 is coupled to the VSS line and capacitor C6 is coupled to the VDD line. NMOS transistor Mn8 has a gate electrode connected to the contact node (node N13) between resistor R7 and capacitor C6, source and substrate electrodes connected to the VSS line and a drain electrode (node N14) connected to the load resistor R8 and the gate electrodes of PMOS transistors Mp51, Mp52 and Mp8. ESD detection circuit 15 transmits the gate-driven signal via node N14 to trigger these ESD protection devices. In addition, the time constant of the RC circuit of the ESD detection circuit 15 is preferably designed to be about 0.1~1.0 $\mu s$, able to differentiate between ESD events and power-on events in ESD detection circuit 15.

The operation of the ESD protection circuit shown in FIG. 8 is described as follows with respect to the four ESD-stress modes.

PS-mode ESD

When a PS-mode ESD event occurs in input pad 120, part of the ESD current is bypassed to the VDD line because the parasitic diode of the PMOS transistor Mp51 is forward-biased with respect to PS-mode ESD. At this time, in ESD detection circuit 15, the voltage of node N13 or the gate electrode of NMOS transistor Mn8 is the same as that of the VDD line since the voltage of the VDD line is electrically coupled to node N13 via capacitor C6 of the RC circuit. Thus, the gate voltage of NMOS transistor Mn8 is higher than its source voltage. NMOS transistor Mn8 is, therefore, turned on and thus the ESD current flows from the VDD line to the VSS line through the NMOS transistor Mn8 and the load resistor R8. Voltage drop caused by the ESD current through the load resistor R8 can help to turn on the PMOS transistors Mp51, Mp52 and Mp8. The ESD current can be discharged through PMOS transistor Mp51 and PMOS transistor Mp8 of power rail clamp circuit 25 to achieve ESD protection.

NS-mode ESD

When an NS-mode ESD event occurs in input pad 120, the parasitic diode of NMOS transistor Mn51 is forward-biased to bypass the negative ESD current to the VSS line for ESD protection.

PD-mode ESD

When a PD-mode ESD event occurs in input pad 120, the parasitic diode of PMOS transistor Mp51 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn51 is forward-biased with respect to ND-mode ESD. At this time, in ESD detection circuit 15, the voltage of node N13 or the gate electrode of MOS transistor Mn8 is the same as that of the VDD line due to the deferral of voltage change caused by capacitor C6 of the RC circuit. Thus, the gate voltage of NMOS transistor Mn8 is higher than its source voltage, the same as the voltage of the VSS line plus the transient ESD voltage. NMOS transistor Mn8 is, therefore, turned on and thus the ESD current flows from the VSS line to the VDD line through the NMOS transistor Mn8 and the load resistor R8. Voltage drop caused by the negative ESD current through the load resistor R8 can help to turn on PMOS transistors Mp51, Mp52 and Mp8. Thus, there are two candidates to bypass the ESD current from input pad 120 to the VDD line. The first is the discharge path constituted by NMOS transistor Mn51 and PMOS transistor Mp8 of the power rail clamp circuit 25. The second is the discharge path constituted by only PMOS transistor Mp51. The practical discharge path of the ESD current is determined by the resistance to ground.

Accordingly, the ESD protection circuit using whole-chip PMOS gate-driven technique of the present embodiment can simultaneously enable at least two different ESD discharge paths when an ND-mode ESD event occurs in the input pad. The ESD current is selectively bypassed through that with the lowest resistance to ground, thereby avoiding the ESD current accidentally flowing into the internal circuitry due to layout or the positions of the ESD devices.

Figure 9:
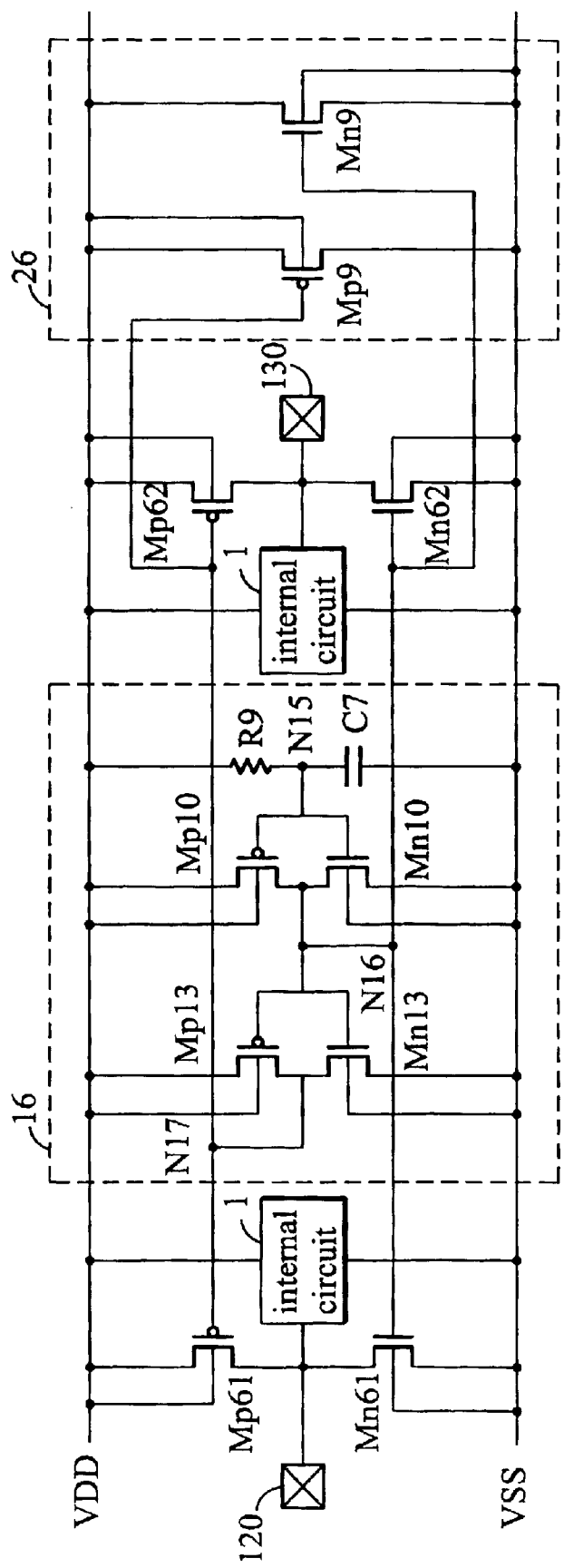
FIG. 9 is a circuit diagram of the ESD protection circuit using a whole-chip gate-driven technique in accordance with the sixth embodiment of the present invention.

Sixth Embodiment:

The present embodiment utilizes both PMOS and NMOS transistors with a gate-driven configuration to achieve ESD protection. FIG. 9 is a circuit diagram of the ESD protection circuit using whole-chip gate-driven technique in accordance with the present embodiment. The ESD protection circuit shown in FIG. 9 comprises an ESD detection circuit 16 and several ESD protection devices connected between input pads 120 and 130 and the VDD and VSS lines. These ESD protection devices include MOS transistors Mp61 and Mn61 connected between input pad 120 and the VDD and VSS lines, MOS transistors Mp62 and Mn62 connected between input pad 130 and the VDD and VSS lines and a power rail clamp circuit 26 comprising an NMOS transistor Mn9 and a PMOS transistor Mp9.

ESD detection circuit 16 is also located between the VDD and VSS lines and transmits gate-driven signals (enabling signals) to the ESD protection devices to simultaneously enable more than one discharge path when an ESD event occurs. The ESD detection circuit shown in FIG. 9 includes a resistor R9, a capacitor C7, a first inverter constituted by NMOS transistors Mn10 and PMOS transistor Mp10, and a second inverter constituted by NMOS transistors Mn13 and PMOS transistor Mp13. Resistor R9 and capacitor C7 are serially connected, where resistor R9 is connected to the VDD line and capacitor C7 is connected to the VSS line. The first inverter has an input node, formed by the gates of MOS transistors Mp10 and Mn10 and connected to a contact node (node N15) of resistor R9 and capacitor C7, and an output node (node N16), connected to the substrates of the NMOS transistors serving as an ESD protection devices including NMOS transistors Mn61, Mn62 and Mn9. In addition, the second inverter has an input node, formed by the gates of transistors Mn13 and Mp13 and connected to the output node N16 of the first inverter, and an output node (node N17), connected to the substrates of the PMOS transistors serving as an ESD protection devices including PMOS transistors Mp61, Mp62 and Mp9. The ESD detection circuit 16, therefore, transmits a first set of the gate-driven signals from node N16 to trigger the NMOS transistors of the ESD protection devices, and a second set of the gate-driven signals from node N17 to trigger the PMOS transistors of the ESD protection devices. Similarly, the time constant of the RC circuit of the ESD detection circuit 16 is preferably designed to be about 0.1~1.0 $\mu$s, able to differentiate between ESD events and power-on events in ESD detection circuit 13.

The operation of the ESD protection circuit shown in FIG. 5 is described as follows with respect to the four ESD-stress modes.

PS-mode ESD

When a PS-mode ESD event occurs in input pad 120, part of the ESD current is bypassed to the VDD line because the parasitic diode of the PMOS transistor Mp61 is forward-biased with respect to PS-mode ESD. At this time, in ESD detection circuit 16, the voltage of node N15 or the gate electrodes of MOS transistor Mp10 and Mn10 in the first inverter is the same as that of the VSS line due to the deferral of voltage change caused by capacitor C7 of the RC circuit. Thus, PMOS transistor Mp10 is turned on since its source voltage is higher than its gate voltage. As well, NMOS transistor Mn10 is turned off since its source and gate voltages are the same. Thus, the voltage of node N16 is close to that of the VDD line. NMOS transistors Mn61, Mn62 and Mn9 are turned on since their gate voltages are higher than their source voltages, respectively. Next, in the second inverter, NMOS transistor Mn13 is turned on since its gate voltage is higher than its source voltage. As well, PMOS transistor Mp13 is turned off since its source and gate voltages are the same. Thus, the voltage of node N17 is close to that of the VSS line. PMOS transistors Mp61, Mp62 and Mp9 are turned on since their gate voltages are lower than their source voltages, respectively.

All NMOS/PMOS transistors are turned on for protection. Accordingly, there are four candidates to bypass the PS-mode ESD current from input pad 120 to the VSS line. The first is the discharge path constituted by PMOS transistor Mp61 and PMOS transistor Mp9 of the power rail clamp circuit 26. The second is the discharge path constituted by only NMOS transistor Mn61. The third is the discharge path constituted by PMOS transistor Mp61, PMOS transistor Mp62 and NMOS transistor Mn62. The fourth is the discharge path constituted by PMOS transistor Mp61 and NMOS transistor Mn9 of the power rail clamp circuit 26. The practical discharge path of the ESD current is determined by the resistance to ground.

NS-mode ESD

When an NS-mode ESD event occurs in input pad 120, the parasitic diode of NMOS transistor Mn61 is forward-biased to bypass the negative ESD current to the VSS line for ESD protection.

PD-mode ESD

When a PD-mode ESD event occurs in input pad 120, the parasitic diode of PMOS transistor Mp61 is forward-biased to bypass the ESD current to the VDD line for ESD protection.

ND-mode ESD

When an ND-mode ESD event occurs in input pad 120, part of the negative ESD current is bypassed to the VSS line because the parasitic diode of the NMOS transistor Mn61 is forward-biased with respect to ND-mode ESD. At this time, in ESD detection circuit 16, the voltage of node N15 or the gate electrodes of MOS transistors Mp10 and Mn10 in the first inverter is the same as that of the VSS line since the voltage of the VSS line is coupled to node N15 through capacitor C7 of the RC circuit. Thus, PMOS transistor Mp10 is turned on since its source voltage is higher than its gate voltage. As well, NMOS transistor Mn10 is turned off since its source and gate voltages are the same. Thus, the voltage of node N15 is close to that of the VDD line and NMOS transistors Mn61, Mn62 and Mn9 are turned on since their gate voltages are higher than their source voltages, respectively. Next, NMOS transistor Mn13 is turned on since its gate voltage is higher than its source voltage. As well, PMOS transistor Mp13 is turned off since the source and gate voltages are the same. Thus, the voltage of node N16 is close to that of the VSS line and PMOS transistors Mp61, Mp62 and Mp9 are turned on since their gate voltages are lower than their source voltages, respectively.

All of PMOS/NMOS transistors for protection are turned on. Accordingly, there are four candidates to bypass the ND-mode ESD current from input pad 120 to the VDD line. The first is the discharge path constituted by NMOS transistor Mn61 and PMOS transistor Mp9 of the power rail clamp circuit 26. The second is the discharge path constituted by only NMOS transistor Mn61. The third is the discharge path constituted by PMOS transistor Mp61, PMOS transistor Mp62 and NMOS transistor Mn62. The fourth is the discharge path constituted by PMOS transistor Mp61 and NMOS transistor Mn9 of the power rail clamp circuit 26. The practical discharge path of the ESD current is determined by the resistance to ground.

Accordingly, the ESD protection circuit using whole-chip gate-driven technique of the present embodiment can simultaneously enable at least four different ESD discharge paths when a PS-mode or ND-mode ESD event occurs in the input pad. The ESD current is selectively bypassed through that with the lowest resistance to ground, thereby avoiding the ESD current accidentally flowing into the internal circuitry due to layout or the positions of the ESD devices.

Figure 10:
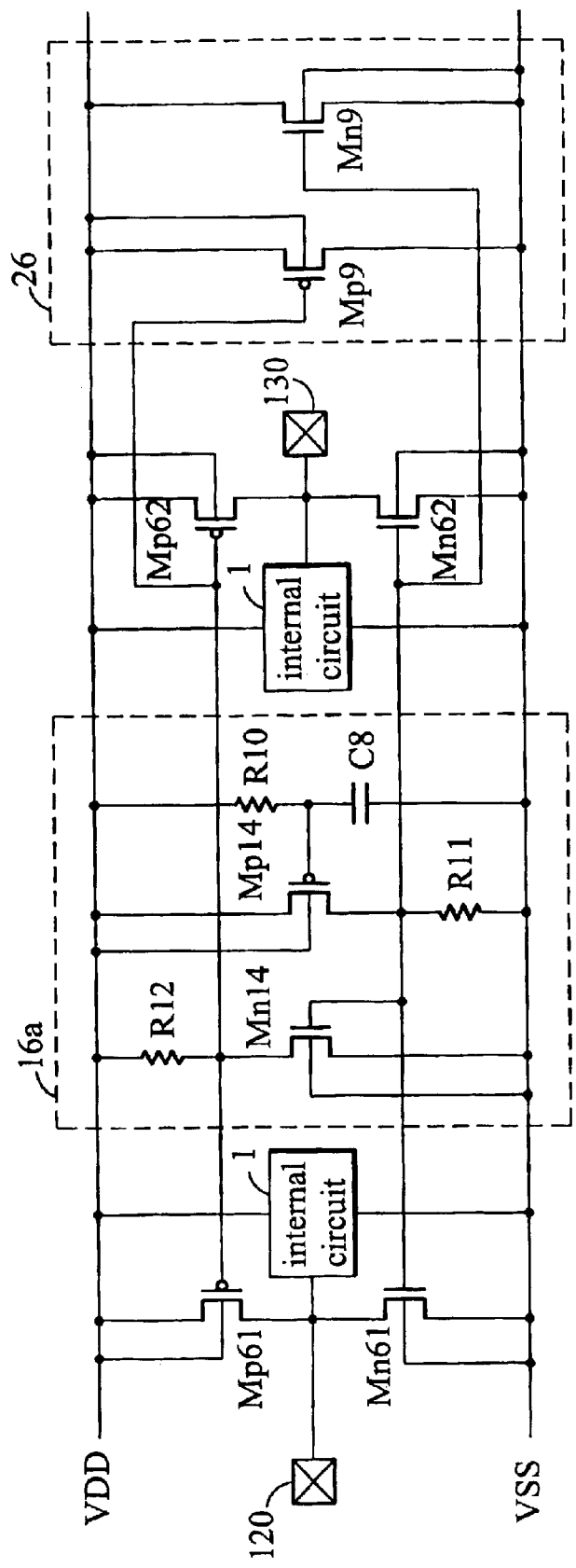
FIG. 10 is a circuit diagram of another example of the ESD protection circuit using a whole-chip gate-driven technique in accordance with the sixth embodiment of the present invention.

FIG. 10 is a circuit diagram of another example of the ESD protection circuit using whole-chip gate-driven technique in accordance with the present embodiment, different from that of the ESD protection circuit shown in FIG. 9 in the circuit design of the ESD detection circuit. As shown in FIG. 10, the ESD detection circuit 16a comprises a resistor R10, a capacitor C8, a PMOS transistor Mp14 and an NMOS transistor Mn14. PMOS transistor Mp14 has a gate electrode connected to the contact node of the resistor R10 and the capacitor C8, source and substrate electrodes connected to the VDD line, and a drain electrode connected to the substrates of the NMOS transistors of the ESD protection devices including NMOS transistors Mn61, Mn62 and Mn9. NMOS transistor Mn14 has a gate electrode connected to the drain electrode of PMOS transistor Mp14, source and substrate electrodes connected to the VSS line and a drain electrode connected to the substrates of the PMOS transistors of the ESD protection devices including PMOS transistors Mp61, Mp62 and Mp9.

The operation of the ESD detection circuit 16a shown in FIG. 10 is basically the same as that of the ESD detection circuit 16 shown in FIG. 9. The advantage of such circuit design is that fewer electronic components are involved and more layout space is reserved.

Figure 11:
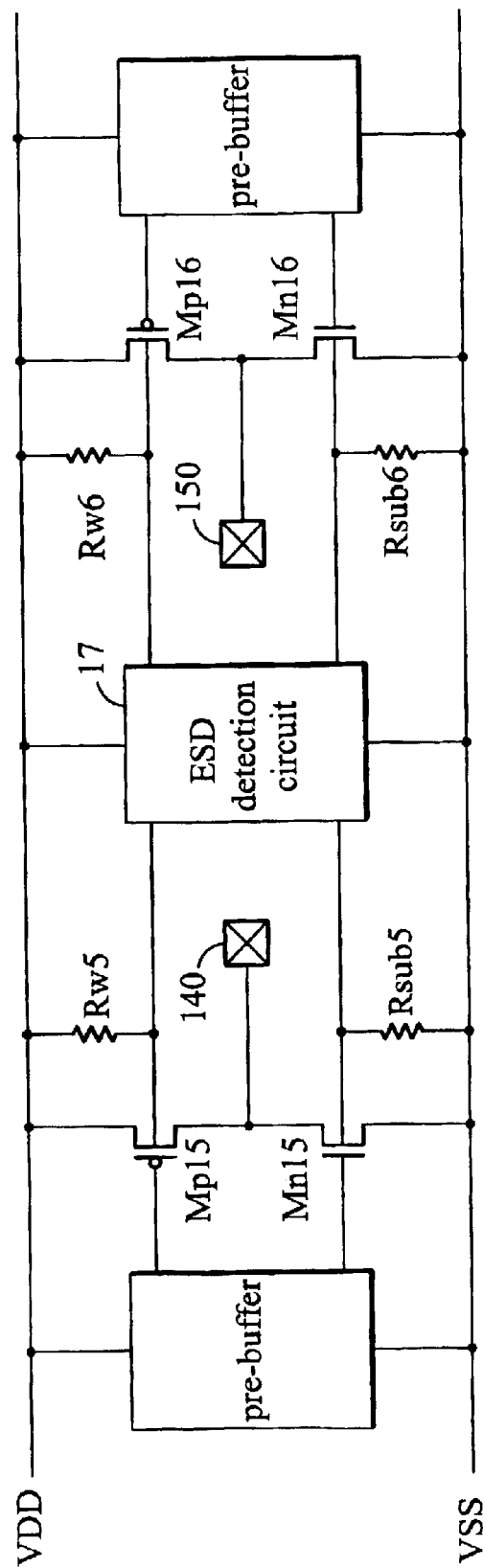
FIG. 11 is a circuit diagram of the ESD protection circuit using a whole-chip protection technique applied in output pads in accordance with the seventh embodiment of the present invention.

Seventh Embodiment:

In the present embodiment, the ESD protection design of the present invention is applied to output pads of an integrated circuit. FIG. 11 is a circuit diagram of the ESD protection circuit using whole-chip protection technique applied in the output pads in accordance with the present embodiment. As shown in FIG. 11, numerals 140 and 150 represent output pads. The ESD protection circuit includes an ESD detection circuit 17 and MOS transistors Mp15 and Mn15 connected to the output pad 140 and MOS transistors Mp16 and Mn16 connected to the output pad 150, respectively. As an ESD event occurs, the ESD detection circuit 17 transmits triggering signals to the substrates of these ESD protection devices including PMOS transistors Mp15 and Mp16 and NMOS transistors Mn15 and Mn16, thereby providing a plurality of ESD discharge paths. In addition, resistors Rsub5 and Rsub6 represent the substrate resistors of NMOS transistors Mn15 and Mn16, and resistors Rw5 and Rw6 represent the N-well resistors of PMOS transistors Mp15 and Mp16. When an ESD event occurs in the output pads 140 and 150, the ESD current can automatically be bypassed through one of these ESD protection devices connected between the VDD/VSS lines with the lowest resistance to ground to achieve ESD protection.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection circuit used in an integrated circuit with a pad, a VDD line and a VSS line, comprising:

a plurality of ESD protection devices connected between two of the pads, the VDD line and the VSS line, respectively; and an ESD detection circuit connected between the VDD line and the VSS line, for generating enabling signals as an ESD current with respect to an ESD-stress mode happens in the pad and flows to the VDD line or VSS line, the enabling signals enabling the ESD protection devices and activating at least two discharge paths constituted by the ESD protection devices to bypass the ESD current.

2. The ESD protection circuit as claimed in claim 1, wherein the ESD protection devices include a metal-oxide-semiconductor (MOS) transistor.

3. The ESD protection circuit as claimed in claim 2, wherein one of the enabling signals is a substrate-triggering signal received by a substrate of the MOS transistor.

4. The ESD protection circuit as claimed in claim 2, wherein one of the enabling signals is a gate-driven signal received by a gate of the MOS transistor.

5. The ESD protection circuit as claimed in claim 1, wherein the ESD detection circuit comprises:
   a resistor and a capacitor serially connected between the VDD line and the VSS line; and
   a first MOS transistor having a gate electrode connected to a contact node of the resistor and the capacitor, a source electrode connected to the VDD or VSS line, and a drain electrode for outputting the enabling signals.

6. The ESD protection circuit as claimed in claim 5, wherein the first MOS transistor is a PMOS transistor and the ESD protection devices are NMOS transistors.

7. The ESD protection circuit as claimed in claim 5, wherein the first MOS transistor is an NMOS transistor and the ESD protection devices are PMOS transistors.

8. The ESD protection circuit as claimed in claim 1, wherein the ESD detection circuit comprises:
   a resistor and a capacitor serially connected between the VDD line and the VSS line;
   a first inverter having an input node connected to a contact node of the resistor and the capacitor and an output node for outputting a first set of the enabling signals to enable NMOS transistors of the ESD protection devices; and
   a second inverter having an input node connected to the node of the first inverter and an output node for outputting a second set of the enabling signals to enable PMOS transistors of the ESD protection devices.

9. The ESD protection circuit as claimed in claim 1, wherein the ESD detection circuit comprises:
   a resistor and a capacitor serially connected between the VDD line and the VSS line;
   a first PMOS transistor having a gate electrode connected to a contact node of the resistor and the capacitor, a source electrode connected to the VDD line and a drain electrode for outputting a first set of the enabling signals to enable NMOS transistors of the ESD protection devices; and
   a first NMOS transistor having a gate electrode connected to the drain electrode of the first PMOS transistor, a source electrode connected to the VSS line and a drain electrode for outputting a second set of the enabling signals to enable PMOS transistors of the ESD protection devices.

10. An electrostatic discharge (ESD) protection circuit used in an integrated circuit with a plurality of pads, a VDD line and a VSS line, comprising:
    a power rail clamp circuit connected between the VDD line and the VSS line;
    a plurality of first ESD protection devices implemented by PMOS transistors and connected between the corresponding pads and the VDD line; and
    a plurality of second ESD protection devices implemented by NMOS transistors and connected between the corresponding pads and the VSS line; and
    an ESD detection circuit connected between the VDD line and the VSS line, for generating enabling signals as an ESD current with respect to an ESD-stress mode flows from the pad and to the VDD or VSS line through one of the first ESD protection devices and the second ESD protection devices, the enabling signals enabling at least two the first ESD protection devices, the second ESD protection devices and the power rail clamp circuit to bypass the ESD current.

11. The ESD protection circuit as claimed in claim 10, wherein the enabling signals are substrate-triggering signals to enable the first ESD protection devices, the second ESD protection devices and the power rail clamp circuit.

12. The ESD protection circuit as claimed in claim 10, wherein the enabling signals are gate-driven signals to enable the first ESD protection devices, the second ESD protection devices and the power rail clamp circuit.

13. The ESD protection circuit as claimed in claim 10, wherein the ESD detection circuit comprises:
    a resistor and a capacitor serially connected between the VDD line and the VSS line; and
    a first MOS transistor having a gate electrode connected to a contact node of the resistor and the capacitor, a source electrode connected to the VDD or VSS line, and a drain electrode for outputting the enabling signals.

14. The ESD protection circuit as claimed in claim 13, wherein the first MOS transistor is a PMOS transistor and transmits the enabling signals to enable NMOS transistors in the second ESD protection devices and the power rail clamp circuit.

15. The ESD protection circuit as claimed in claim 13, wherein the first MOS transistor is an NMOS transistor and transmits the enabling signals to enable PMOS transistors in the first ESD protection devices and the power rail clamp circuit.

16. The ESD protection circuit as claimed in claim 10, wherein the ESD detection circuit comprises:
    a resistor and a capacitor serially connected between the VDD line and the VSS line;
    a first inverter having an input node connected to a contact node of the resistor and the capacitor and an output node for outputting a first set of the enabling signals to enable NMOS transistors in the second ESD protection devices and the power rail clamp circuit; and
    a second inverter having an input node connected to the output node of the first inverter and an output node for outputting a second set of the enabling to enable PMOS transistors in the first ESD protection devices and the power rail clamp circuit.

17. The ESD protection circuit as claimed in claim 10, wherein the ESD detection circuit comprises:
    a resistor and a capacitor serially connected between the VDD line and the VSS line;
    a first PMOS transistor having a gate electrode connected to a contact node of the resistor and the capacitor, a source electrode connected to the VDD line and a drain electrode for outputting a first set of the enabling signals to enable NMOS transistors in the second ESD protection devices and the power rail clamp circuit; and a first NMOS transistor having a gate electrode connected to the drain electrode of the first PMOS transistor, a source electrode connected to the VSS line and a drain electrode for outputting a second set of the enabling signals to enable PMOS transistors in the first ESD protection devices and the power rail clamp circuit.

* * * * *